US010153629B2

(12) United States Patent
Greenwood

(10) Patent No.: US 10,153,629 B2
(45) Date of Patent: Dec. 11, 2018

(54) THERMAL COOLING INTERFACE FOR ELECTRICAL JOINTS

(71) Applicant: ABB Schweiz AG, Baden (CH)

(72) Inventor: Peter James Greenwood, Cheshire, CT (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/216,393

(22) Filed: Jul. 21, 2016

(65) Prior Publication Data

US 2018/0027693 A1 Jan. 25, 2018
US 2018/0220547 A9 Aug. 2, 2018

(51) Int. Cl.
| | |
|---|---|
| *H02G 5/10* | (2006.01) |
| *F28F 13/08* | (2006.01) |
| *H05K 7/20* | (2006.01) |
| *H01R 25/14* | (2006.01) |
| *H02B 1/56* | (2006.01) |

(52) U.S. Cl.
CPC ............. *H02G 5/10* (2013.01); *F28F 13/08* (2013.01); *H01R 25/145* (2013.01); *H02B 1/56* (2013.01); *H05K 7/2039* (2013.01)

(58) Field of Classification Search
CPC ......... F28F 13/00–13/187; H02B 1/56; H02G 5/10; H05K 7/20127; H05K 7/20154; H05K 7/2039–7/20518
USPC .................................................. 361/676–678
See application file for complete search history.

(56) References Cited

U.S. PATENT DOCUMENTS

| | | | |
|---|---|---|---|
| 4,886,940 A | 12/1989 | Gagnon et al. | |
| 6,018,455 A * | 1/2000 | Wilkie, II | H02B 1/21 165/80.3 |
| 6,510,047 B2 * | 1/2003 | Meiners | H01H 85/47 218/118 |
| 6,574,094 B1 | 6/2003 | Morrow et al. | |

(Continued)

FOREIGN PATENT DOCUMENTS

| | | |
|---|---|---|
| CN | 102751001 A | 10/2012 |
| CN | 204131049 U | 1/2015 |

(Continued)

OTHER PUBLICATIONS

Lehnberger C, "High current PCBs—system integration of busbars and electronics", Electric Drives Production Conference (EDPC), 2011 1st International, pp. 63-64, Sep. 28-29, 2011, Nuremberg.

(Continued)

*Primary Examiner* — Zachary M Pape
(74) *Attorney, Agent, or Firm* — Barnes & Thornburg LLP

(57) ABSTRACT

An electrical joint is provided. The electrical joint includes a first conductive component, a second conductive component, and a thermal cooling interface positioned between the first and second conductive components, the thermal cooling interface including a base plate coupled to the first conductive component, and a plurality of walls extending orthogonally from the base plate towards the second conductive component, the plurality of walls defining a plurality of cooling channels that channel air therethrough to facilitate cooling the first and second conductive components, wherein the first conductive component, the thermal cooling interface, and the second conductive component are electrically coupled in series.

28 Claims, 7 Drawing Sheets

(56) References Cited

U.S. PATENT DOCUMENTS

| | | | | |
|---|---|---|---|---|
| 6,786,749 B2* | 9/2004 | Meiners | .................... | H02G 5/00 |
| | | | | 174/71 B |
| 6,995,648 B2* | 2/2006 | Jur | ....................... | H01H 85/044 |
| | | | | 337/165 |
| 8,177,569 B1 | 5/2012 | Dozier et al. | | |
| 8,188,392 B2* | 5/2012 | Isberg | ..................... | H01H 1/06 |
| | | | | 200/279 |
| 8,339,772 B2 | 12/2012 | Peralta et al. | | |
| 8,717,746 B2* | 5/2014 | Kaufmann | ............... | H01H 9/52 |
| | | | | 174/260 |
| 8,792,226 B2 | 7/2014 | Dhar et al. | | |
| 8,926,351 B2 | 1/2015 | O'Leary et al. | | |
| 9,001,499 B2* | 4/2015 | Kolberg | .................. | H01H 9/52 |
| | | | | 361/676 |
| 2008/0266803 A1* | 10/2008 | Golhardt | .................. | H02K 9/20 |
| | | | | 361/700 |
| 2011/0024150 A1* | 2/2011 | Subramaniam | .......... | H02G 5/10 |
| | | | | 174/15.1 |
| 2011/0139429 A1* | 6/2011 | Salapakkam | ......... | H01L 23/467 |
| | | | | 165/185 |
| 2014/0014308 A1* | 1/2014 | Wu | .......................... | F28F 3/02 |
| | | | | 165/185 |
| 2014/0313642 A1 | 10/2014 | Zhang et al. | | |

FOREIGN PATENT DOCUMENTS

| | | |
|---|---|---|
| GB | 1393090 A | 5/1975 |
| JP | 2015002644 A | 1/2015 |
| KR | 20150117474 A | 10/2015 |

OTHER PUBLICATIONS

European Search Report and Opinion issued in connection with corresponding EP Application No. 17182275.2 dated Nov. 21, 2017.

\* cited by examiner

THERMAL COOLING INTERFACE FOR ELECTRICAL JOINTS

BACKGROUND

The field of the invention relates generally to electrical joints, and, more particularly, to a thermal cooling interface for electrical joints.

Electrical joints joining two or more conductive components are used in a variety of industries. For example, in electrical power distribution systems, elongated rectangular flat conductive busbar members may be arranged within electrical bus sections for transporting multi-phase high current electric power through industrial, commercial, and/or residential establishments. Successive elongated bus sections are electrically connected or interlocked together to provide electrical continuity between a power source and a power consuming load.

When bus sections are electrically interconnected in a conventional installation, a self-contained bus joint is typically employed. The bus joint is one example of an electrical joint. In at least some scenarios, the bus sections and the bus joint generate enough heat when transporting power that the amount of heat generated can damage or otherwise reduce the performance of the bus system. Accordingly, bus joints should satisfy UL/IEC specifications to prevent such damage. The connection point between the bus sections and the bus joint is generally the hottest portion of bus systems. Even with the use of thermally conductive materials throughout the bus sections and the bus joint, the generated heat may be sufficient to cause component damage. Further, similar thermal issues may be encountered in other types of electrical joints.

BRIEF DESCRIPTION

In one aspect, an electrical joint is provided. The electrical joint includes a first conductive component, a second conductive component, and a thermal cooling interface positioned between the first and second conductive components, the thermal cooling interface including a base plate coupled to the first conductive component, and a plurality of walls extending orthogonally from the base plate towards the second conductive component, plurality of walls defining a plurality of cooling channels that channel air therethrough to facilitate cooling the first and second conductive components, wherein the first conductive component, the thermal cooling interface, and the second conductive component are electrically coupled in series.

In another aspect, a thermal cooling interface for electrically coupling a first conductive component to a second conductive component is provided. The thermal cooling interface is positionable between the first and second conductive components and includes a base plate coupled to the first conductive component when the thermal cooling interface is positioned between the first and second conductive components, and a plurality of walls extending orthogonally from the base plate towards the second conductive component, the plurality of walls defining a plurality of cooling channels that channel air therethrough to facilitate cooling the first and second conductive components, wherein the first conductive component, the thermal cooling interface, and the second conductive component are electrically coupled in series.

In yet another aspect, a method of assembling an electrical joint is provided. The method includes positioning first and second conductive components proximate one another, positioning a thermal cooling interface between the first and second conductive components, the thermal cooling interface including a base plate coupled to the first conductive component, and a plurality of walls extending orthogonally from the base plate towards the second conductive component, the plurality of walls defining a plurality of cooling channels that channel air therethrough to facilitate cooling the first and second conductive components, and coupling the first conductive component to the second conductive component using at least one of a fastener and a clamp, wherein the first conductive component, the thermal cooling interface, and the second conductive component are electrically coupled in series.

In yet another aspect, an electrical joint is provided. The electrical joint includes a first conductive component including a first thermal cooling interface portion having a first plurality of walls, and a second conductive component including a second thermal cooling interface portion having a second plurality of walls, wherein the first plurality of walls contact the second plurality of walls to define a plurality of cooling channels that channel air therethrough to facilitate cooling said first and second conductive components, and wherein the first and second thermal cooling interface portions define a current path between the first and second conductive components.

DETAILED DESCRIPTION

Various embodiments disclosed herein provide electrical joints with thermal cooling interfaces for electrically coupling conductive components. As used herein, an "electrical joint" refers to any joint electrically coupling two or more conductive components. The electrical joint may be, for example, a bus joint in a bus system. As used herein, a "bus joint" refers to a portion of a bus system (e.g., a joint, section, fitting, etc.) that joins two or more busbars.

In the embodiments described herein, the thermal cooling interface includes a plurality of walls extending from a base plate. The plurality of walls define a plurality of cooling channels to facilitate passive cooling between two connected conductive components. For example, the thermal cooling interface may be coupled between two busbars.

Figure 1:
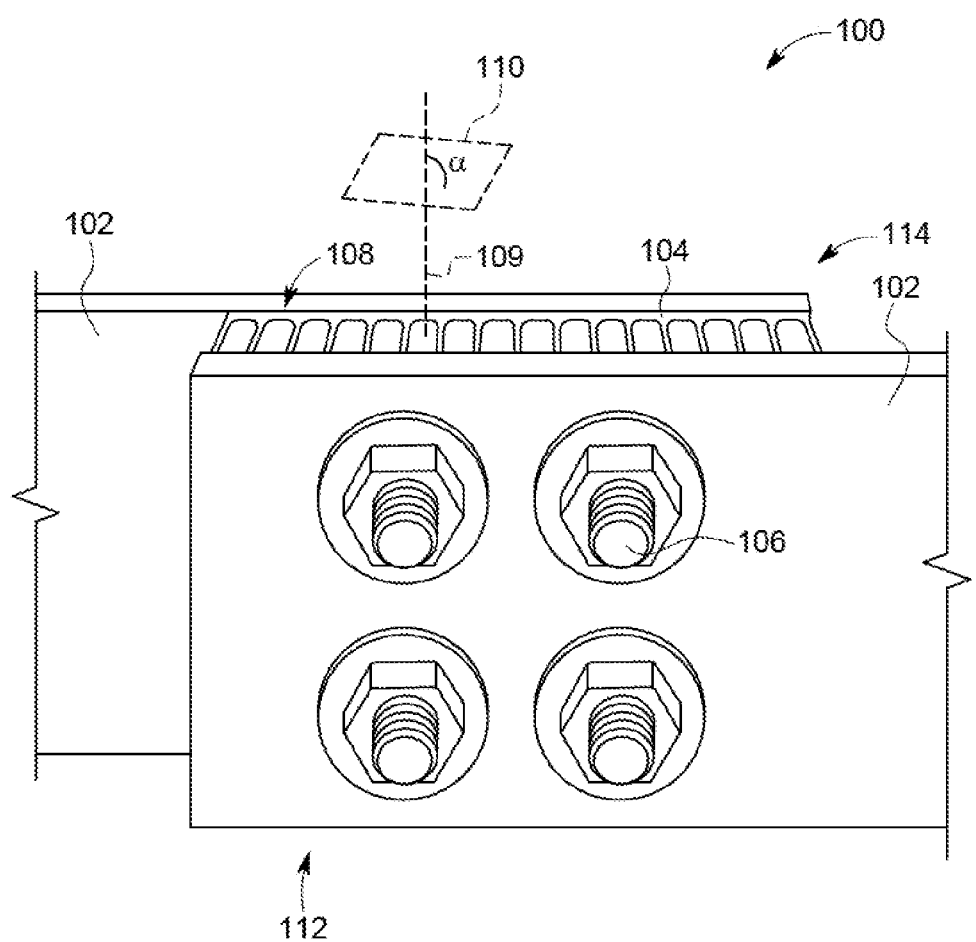
FIG. 1 is a perspective view an exemplary electrical joint including two conductive components electrically coupled to one another using a thermal cooling interface.
Figure 2:
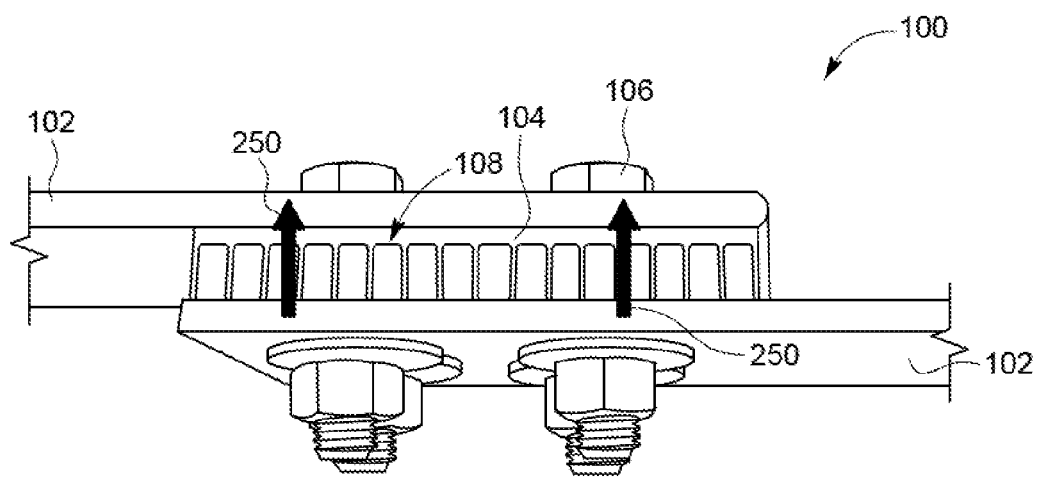
FIG. 2 is a top perspective view of the electrical joint shown in FIG. 1.

FIG. 1 is a perspective view of an exemplary electrical joint 100. FIG. 2 is a top perspective view of electrical joint 100. Electrical joint 100 includes two conductive components 102 electrical coupled to each other using a thermal cooling interface 104. Specifically, thermal cooling interface 104 is positioned between conductive components 102. In the exemplary embodiment, conductive components 102 are busbars. For example, conductive components 102 may be busbars in a single-phase system or three-phase system, and may include a protective coating outer layer (not shown) to prevent arcing between busbars of different phases. In one embodiment, the busbars are both approximately 0.25 inches thick and 4.0 inches wide. In other embodiments, the busbars may have any dimensions that enable electrical joint 100 to function as described herein. Alternatively, conductive components 102 may be any conductive components capable of being electrically coupled to one another using thermal cooling interface 104.

As shown in FIG. 1, in the exemplary embodiment, one or more fasteners 106 are used to couple conductive components 102 and thermal cooling interface 104. Fasteners 106 include, but are not limited to, screws, bolts, and/or clamps. Further, fasteners 106 may be thermally and/or electrically conductive. In some embodiments, one or more clamps (not shown) are used to couple conductive components 102 and thermal cooling interface 104

Thermal cooling interface 104 defines a plurality of cooling channels 108 between conductive components 102. Notably, at least some known temperature control elements use heat sinks, cooling fins, etc. to radiate heat. In contrast, thermal cooling interface 104 passively causes air to flow through cooling channels 108, as described herein. As shown in FIGS. 1 and 2, cooling channels 108 are vertically oriented in the exemplary embodiment. Specifically, each cooling channel 108 has a longitudinal axis 109 that makes an angle, α, of approximately 90° with a horizontal plane 110. Horizontal plane 110 may be, for example, generally parallel to the surface of the Earth (i.e., the ground). Because of the vertical orientation, air is pulled into a bottom 112 of electrical joint and flows upwards (i.e., away from bottom 112 of electrical joint 100 towards a top 114 of electrical joint 100) through thermal cooling interface 104. This flow of air from bottom 112 to top 114 facilitates substantially cooling conductive components 102. For example, it was experimentally demonstrated that if conductive components 102 are busbars having a thickness of 0.5 inches and a width of 4.0 inches and are electrically coupled to one another without thermal cooling interface 104, the temperature of electrical joint 100 increases approximately 65° Fahrenheit (F) with approximately 1425 Amps (A) of current flowing through conductive components 102. In contrast, with thermal cooling interface 104 positioned between conductive components 102 that are busbars having a thickness of 0.5 inches and a width of 4.0 inches, the temperature of electrical joint 100 does not increase by 65° F. until approximately 1550 A of current flows through conductive components 102.

In other embodiments, the angle α is less than 90°. For example, the angle α may be any angle between and including approximately 45° and approximately 90°. Notably, if the angle α is less than approximately 45°, cooling channels 108 are substantially horizontally oriented, and little air flow occurs through cooling channels 108, substantially reducing the passive cooling benefits of thermal cooling interface 104.

Figure 3:
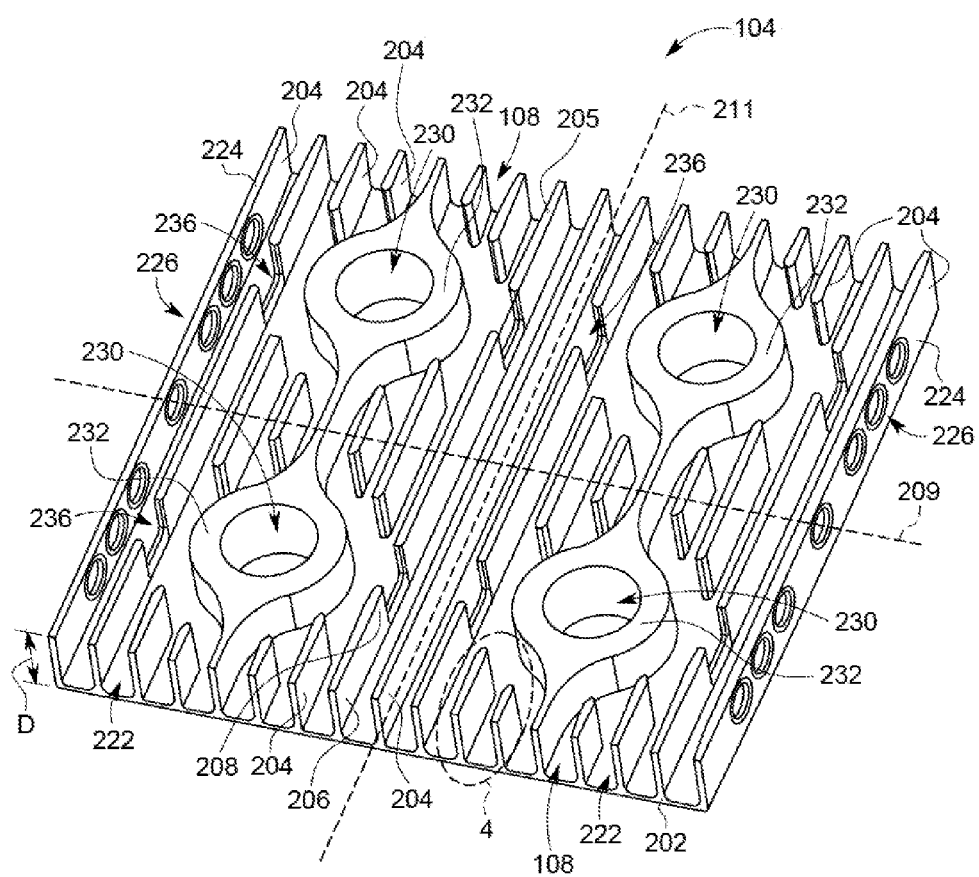
FIG. 3 is a perspective view of an exemplary thermal cooling interface that may be used with the electrical joint shown in FIG. 1.
Figure 4:
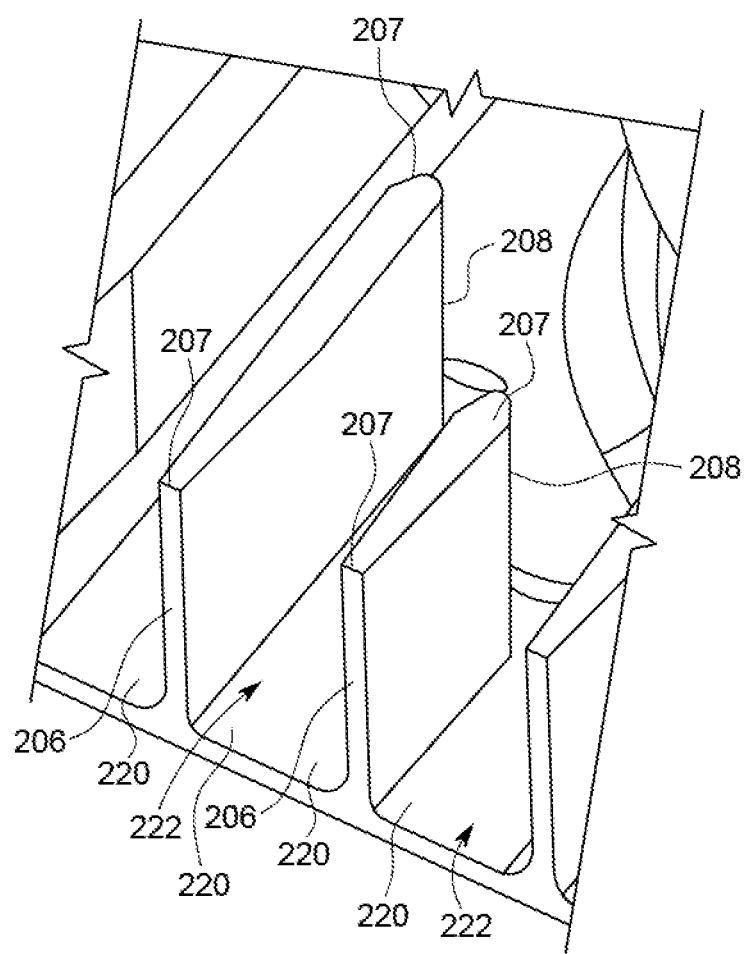
FIG. 4 is a perspective view of an enlarged portion of the thermal cooling interface shown in FIG. 3.
Figure 5:
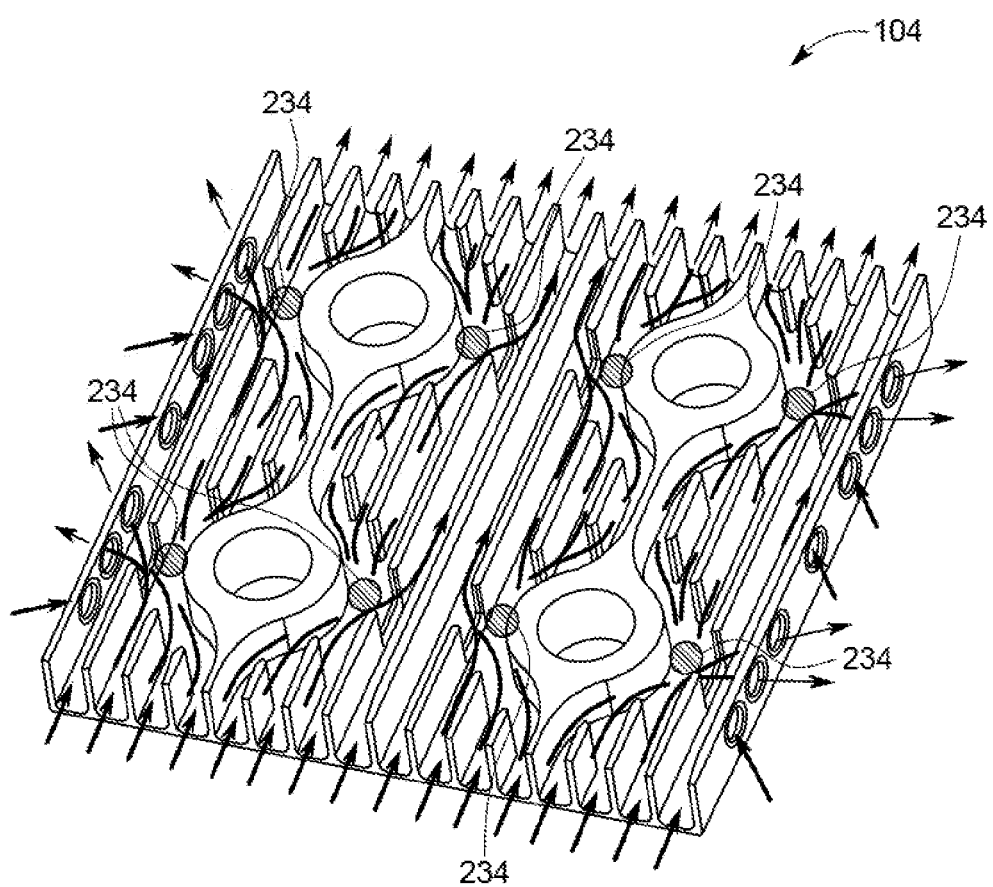
FIG. 5 is a diagram showing air flow though the thermal cooling interface shown in FIG. 3.

FIG. 3 is a perspective view of thermal cooling interface 104. FIG. 4 is an enlarged view of a portion of thermal cooling interface 104. FIG. 5 is a diagram showing air flow though thermal cooling interface 104. As shown in FIG. 3, thermal cooling interface 104 includes a base plate 202 and a plurality of walls 204 extending substantially orthogonally from base plate 202. During operation, base plate 202 contacts one of conductive components 102, and top surfaces 205 of walls 204 contact the other of conductive components 102 to enclose cooling channels 108.

In the exemplary embodiment, each wall 204 extends from a leading edge 206 to a trailing edge 208. Notably, as best shown in FIG. 4, in the exemplary embodiment, leading and trailing edges 206 and 208 of each wall 204 have an aerodynamic profile 207 to facilitate maximum air flow through cooling channels 108. That is, leading and trailing edges 206 and 208 are chamfered, include a lead-in angle, and/or are otherwise shaped to increase air flow through cooling channels 108. Further, in the exemplary embodiment, thermal cooling interface 104 is symmetrical about a first symmetry axis 209 and a second symmetry axis 211. Accordingly, thermal cooling interface 104 functions identically, whether positioned as shown in FIGS. 1 and 2, or rotated 180° about first symmetry axis 209.

As best shown in FIG. 4, in the exemplary embodiment, interfaces 220 between walls 204 and base plate 202 are substantially arcuate. Accordingly, an inlet 222 for each cooling channel 108 has a substantially U-shaped profile, further improving air flow through cooling channels 108. The arcuate interfaces 220 also increase the structural strength of thermal cooling interface 104 to prevent buckling. The various aerodynamic features of thermal cooling interface 104 facilitate eliminating any eddy currents that would otherwise reduce efficiency.

Walls 204 of thermal cooling interface 104 include two side walls 224, each side wall 224 having a plurality of apertures 226 defined therethrough. In the exemplary embodiment, each side wall 224 includes seven circular apertures 226. Alternatively, each side wall 224 may include any number of apertures 226 having any shape that enables thermal cooling interface 104 to function as described herein. As shown in FIG. 5, apertures 226 also facilitate improving air flow through thermal cooling interface 104. Specifically, for each side wall 224, during operation, cool air flows into three of apertures 226 and hot air flows out of four of apertures 226. Cool air is entrained into the three apertures 226 by the air flow through cooling channels 108.

In the exemplary embodiment, thermal cooling interface 104 includes a plurality of fastener apertures 230 defined therethrough. Fastener apertures 230 are sized and oriented to receive fasteners 106 (shown in FIGS. 1 and 2) such that fasteners 106 extend through thermal cooling interface 104. Each fastener aperture is defined by a compression limiting feature 232 extending from base plate 202. Compression limiting feature 232 is relatively thick to facilitate preventing damage to thermal cooling interface 104 when thermal cooling interface 104 is clamped between conductive components 102 (e.g., by tightening or clamping fasteners 106).

Notably, compression limiting features 232 obstruct and modify the air flow through at least some of the plurality of cooling channels 108. Specifically, high pressure zones 234 are formed on either side of each compression limiting features 232, as shown in FIG. 5. Accordingly, in the exemplary embodiment, at least some of walls 204 include pressure relief apertures 236 defined therethrough proximate high pressures zones 234. Pressure relief apertures 236 facilitate directing air flow out of high pressures zones 234 into adjacent cooling channels 108, as shown in FIG. 5. Further, in the exemplary embodiment, at least some of apertures 226 are positioned proximate pressure relief apertures 236. This facilitates minimizing an impact compression limiting features 232 have on air flow through thermal cooling interface 104. In the exemplary embodiment, pressure relief apertures 236 are substantially U-shaped. Alternatively, pressure relief apertures 236 may have any shape that enables thermal cooling interface 104 to function as described herein.

Notably, thermal cooling interface 104 facilitates passively cooling electrical joint 100. That is, to realize the cooling benefits of thermal cooling interface 104, no active devices (e.g., fans) need to be used to stimulate air flow through cooling channels 108. Rather, the shape and orientation of thermal cooling interface 104 passively causes air to flow through cooling channels 108. In some embodiments, a fan may be used to further enhance performance of thermal cooling interface 104. Accordingly, the combination of various features of thermal cooling interface 104, as described herein, provide significant cooling benefits over at least some known temperature control devices (e.g., heat sinks, cooling fins, etc.).

Thermal cooling interface 104 may be formed, for example, using machining techniques. Further, thermal cooling interface 104 has a depth, D, of approximately 0.5 inches in the exemplary embodiment. Additionally, to facilitate electrically coupling conductive components 102 to one another, thermal cooling interface 104 is formed of an electrically and thermally conductive material (e.g., copper). Accordingly, one conductive component 102, thermal cooling interface 104, and the other conductive component 102 are electrically coupled in series, and thermal cooling interface 104 defines a current path 250 (shown in FIG. 2) between conductive components 102. That is, when current flows between conductive components 102, current flows through thermal cooling interface 104. Alternatively, thermal cooling interface 104 may have any dimensions and/or composition, and/or be formed using any manufacturing techniques that enable thermal cooling interface 104 to function as described herein.

Figure 6:
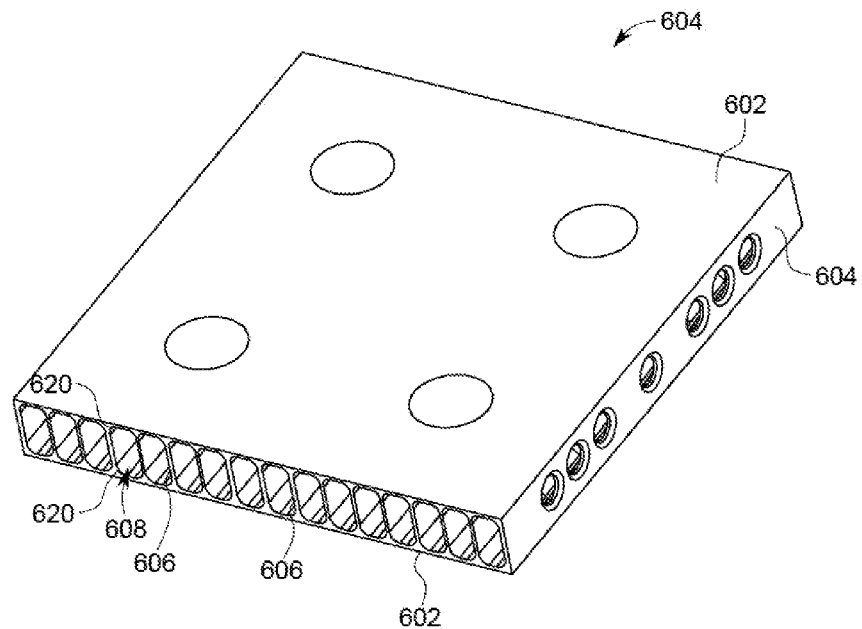
FIG. 6 is a perspective view of an alternative exemplary thermal cooling interface.

For example, FIG. 6 is a perspective view of an alternative thermal cooling interface 604 formed using additive manufacturing techniques (e.g., three-dimensional printing). Thermal cooling interface 604 is substantially similar to thermal cooling interface 104. However, because additive manufacturing techniques generally produce objects with closed surfaces, thermal cooling interface 604 includes two base plates 602 (as opposed to a single base plate 202), with walls 606 extending between base plates 602. Base plates 602 may be plated with suitable metals (e.g., silver, gold, etc.). Base plates in other embodiments may also be plated with suitable metals. Notably, thermal cooling interface 604 includes arcuate interfaces 620 at both the top and bottom of each wall 606, further increasing cooling flow through cooling channels 608 defined by walls 606.

Figure 7:
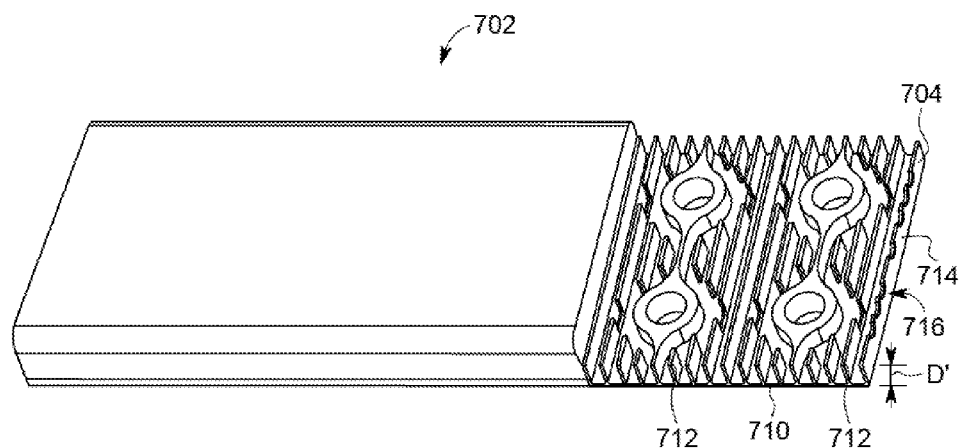
FIG. 7 is a perspective view of an exemplary conductive component with an integrated thermal cooling interface portion.

In the embodiments, shown in FIGS. 1-6, the thermal cooling interface is a separate component from conductive components 102. However, in some embodiments, the thermal cooling interface may be integrated with conductive components 102. For example, FIG. 7 is a perspective view of a conductive component 702 that includes an integrated thermal cooling interface portion 704. Thermal cooling interface portion 704 may be formed, for example, by milling material of conductive component 702.

Thermal cooling interface portion 704 includes a base plate 710 and a plurality of walls Similar to thermal cooling interface 104, thermal cooling interface portion 704 includes a base plate 710 and a plurality of walls 712. However, thermal cooling interface portion 704 has a depth, D', that is approximately one-half the depth D of thermal cooling interface 104. For example, thermal cooling interface portion 704 may have a depth D' of approximately 0.25 inches.

Further, because thermal cooling interface portion 704 is integral with conductive component 702, thermal cooling interface portion 704 only includes a single side wall 714 having apertures 716. Further, because of the limited depth, each aperture 716 is approximately half the size of apertures 226.

Figure 8:
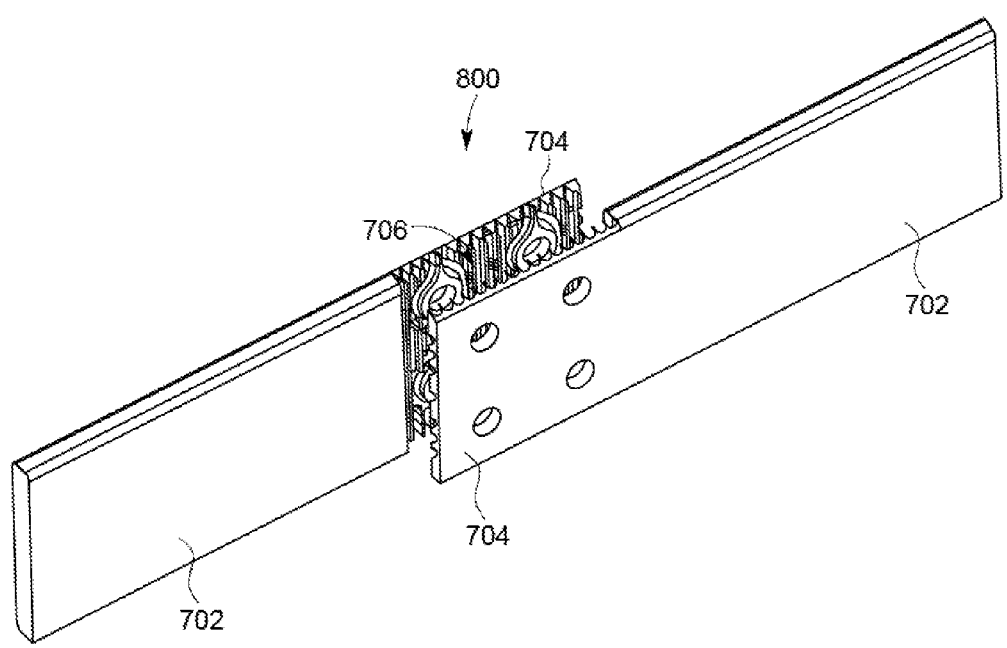
FIG. 8 is a perspective view of an exemplary electrical joint formed using two of the conductive components shown in FIG. 7.

As shown in FIG. 8, to form a conductive joint 800, two conductive components 702 are coupled to one another. Specifically, two thermal cooling interface portions 704 (i.e., one from each conductive component 102) abut one another to form a complete thermal cooling interface 706. Notably, complete thermal cooling interface 706 functions substantially similar to thermal cooling interface 104 and thermal cooling interface 604.

The systems and methods described herein provide an electrical joint including a thermal cooling interface positioned between first and second electrical components. The thermal cooling interface includes a plurality of walls that define a plurality of cooling channels. The cooling channels channel air therethrough to facilitate cooling the first and second conductive components This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electrical joint, comprising:
a first conductive component;
a second conductive component spaced from said first conductive component; and
a thermal cooling interface positioned between said first and second conductive components, said thermal cooling interface comprising:
a base plate coupled to said first conductive component; and
a plurality of walls, each wall of said plurality of walls extending from said base plate towards said second conductive component and connected thereto,
said plurality of walls, said base plate, and said second conductive component cooperatively defining a plurality of enclosed cooling channels therebetween to channel air therethrough to facilitate cooling said first and second conductive components.

2. An electrical joint in accordance, with claim 1, wherein said plurality of walls define a plurality of substantially vertically oriented cooling channels.

3. An electrical joint in accordance with claim 1, wherein said plurality of walls comprise at least one sidewall, said at least one sidewall having a plurality of apertures defined therethrough to increase air flow through the plurality of cooling channels.

4. An electrical joint in accordance with claim 1, further comprising a fastener coupling said first and second conductive components, wherein said thermal cooling interface comprises a compression limiting feature that defines a fastener aperture therethrough, and wherein said fastener extends through the fastener aperture.

5. An electrical joint in accordance with claim 4, wherein said compression limiting feature defines a high pressure zone within one of the plurality of cooling channels, and wherein a wall of said plurality of walls includes a pressure relief aperture defined therethrough and proximate the high pressure zone to alleviate pressure in the high pressure zone.

6. An electrical joint in accordance with claim 1, wherein each wall of said plurality of walls comprises a top surface that contacts said second conductive component.

7. An electrical joint in accordance with claim 1, wherein each wall of said plurality of walls comprises a leading edge and a trailing edge, and wherein said leading and trailing edges have an aerodynamic profile to increase air flow through said thermal cooling interface.

8. An electrical joint in accordance with claim 1, wherein said thermal cooling interface defines a current path in series between said first and second conductive components.

9. The electrical joint of claim 1 wherein said base plate, said plurality of walls, and said second conductive component cooperatively enclose said plurality of cooling channels to channel air therethrough to facilitate cooling said first and second conductive components.

10. A thermal cooling interface for electrically coupling a first conductive component to a second conductive component, said thermal cooling interface positionable between the first and second conductive components and comprising:
  a base plate coupled to the first conductive component when said thermal cooling interface is positioned between the first and second conductive components; and
  a plurality of walls, each wall of the plurality of walls extending from said base plate towards the second conductive component and connected thereto, said plurality of walls, said baseplate, and said second conductive component cooperatively defining a plurality of enclosed cooling channels therebetween that channel air therethrough to facilitate cooling the first and second conductive components.

11. A thermal cooling interface in accordance with claim 10, wherein said plurality of walls define a plurality of substantially vertically oriented cooling channels when said thermal cooling interface is positioned between the first and second conductive components.

12. A thermal cooling interface in accordance with claim 10, wherein said plurality of walls comprise at least one sidewall, said at least one sidewall having a plurality of apertures defined therethrough to increase air flow through the plurality of cooling channels.

13. A thermal cooling interface in accordance with claim 10, further comprising a compression limiting feature that defines a fastener aperture therethrough.

14. A thermal cooling interface in accordance with claim 13, wherein said compression limiting feature defines a high pressure zone within one of the plurality of cooling channels, and wherein a wall of said plurality of walls includes a pressure relief aperture defined therethrough and proximate the high pressure zone to alleviate pressure in the high pressure zone.

15. A thermal cooling interface in accordance with claim 10, wherein each wall of said plurality of walls comprises a top surface that contacts the second conductive component when said thermal cooling interface is positioned between the first and second conductive components.

16. A thermal cooling interface in accordance with claim 10, wherein each wall of said plurality of walls comprises a leading edge and a trailing edge, and wherein said leading and trailing edges have an aerodynamic profile to increase air flow through said thermal cooling interface.

17. A method of assembling an electrical joint, said method comprising:
  positioning first and second conductive components proximate one another;
  positioning a thermal cooling interface between the first and second conductive components, the thermal cooling interface including a base plate coupled to the first conductive component, and a plurality of walls, each wall of the plurality of walls extending from the base plate towards the second conductive component and connected thereto, the plurality of walls, the baseplate, and the second conductive component cooperatively defining a plurality of enclosed cooling channels that channel air therethrough to facilitate cooling the first and second conductive components; and
  coupling the first conductive component to the second conductive component using at least one of a fastener and a clamp.

18. A method in accordance with claim 17, wherein coupling the first conductive component to the second conductive component comprises inserting at least one fastener through at least one fastener aperture defined in the thermal cooling interface.

19. A method in accordance with claim 17, wherein positioning a thermal cooling interface comprises positioning the thermal cooling interface such that a top surface of each of the plurality of walls contacts the second conductive component.

20. An electrical joint comprising:
  a first conductive component comprising a first thermal cooling interface portion having a first plurality of walls;
  a second conductive component comprising a second thermal cooling interface portion having a second plurality of walls, the second plurality of walls aligned with the first plurality of walls; and
  a fastener arranged to fixedly couple the first plurality of walls of the first conductive component to the second plurality of walls of the second conductive component;
  wherein the first plurality of walls contact the second plurality of walls, and wherein the first and second thermal cooling interface portions, and the first and second plurality of walls cooperate to define a plurality of cooling channels therebetween that channel air therethrough to facilitate cooling said first and second conductive components, and wherein the first and second thermal cooling interface portions define a current path between the first and second conductive components.

21. A thermal cooling interface for electrically coupling a first conductive component to a second conductive component, said thermal cooling interface positionable between the first and second conductive components, comprising:
  a first base plate coupleable to the first conductive component when said thermal cooling interface is positioned between the first and second conductive components;
  a second base plate coupleable to the second conductive component when said thermal cooling interface is positioned between the first and second conductive components; and
  a plurality of walls arranged in parallel, each wall of the plurality of walls fixedly coupled at a first end to said first base plate, and fixedly coupled at a second end to said second base plate, wherein said plurality of walls, said first base plate, and said second base plate cooperatively define a plurality of cooling channels to channel air therethrough to facilitate cooling the first and second conductive components.

22. The thermal cooling interface of claim 21 wherein the first conductive component, said thermal cooling interface, and the second conductive component are electrically coupleable in series.

23. The thermal cooling interface in accordance with claim 21, wherein said plurality of walls define a plurality of substantially vertically oriented cooling channels.

24. The thermal cooling interface in accordance with claim 21, wherein said plurality of walls comprise at least one sidewall, said at least one sidewall having a plurality of apertures defined therethrough to increase air flow through the plurality of cooling channels.

25. The thermal cooling interface in accordance with claim 21, further comprising a fastener coupling said first and second conductive components, wherein said thermal cooling interface comprises a compression limiting feature that defines a fastener aperture therethrough, and wherein said fastener extends through the fastener aperture.

26. The thermal cooling interface in accordance with claim 25, wherein said compression limiting feature defines a high pressure zone within one of the plurality of cooling channels, and wherein a wall of said plurality of walls includes a pressure relief aperture defined therethrough and proximate the high pressure zone to alleviate pressure in the high pressure zone.

27. The thermal cooling interface in accordance with claim 21, wherein each wall of said plurality of walls comprises a leading edge and a trailing edge, and wherein said leading and trailing edges have an aerodynamic profile to increase air flow through said thermal cooling interface.

28. The thermal cooling interface in accordance with claim 21, wherein said thermal cooling interface defines a current path in series between said first and second conductive components.

* * * * *